United States Patent [19]

Whann et al.

[11] Patent Number: 4,837,622
[45] Date of Patent: * Jun. 6, 1989

[54] HIGH DENSITY PROBE CARD

[75] Inventors: Welton B. Whann, San Diego; Paul M. Elizondo, Escondido, both of Calif.

[73] Assignee: Micro-Probe, Inc., San Diego, Calif.

[*] Notice: The portion of the term of this patent subsequent to Jul. 12, 2005 has been disclaimed.

[21] Appl. No.: 209,915

[22] Filed: Jun. 22, 1988

Related U.S. Application Data

[63] Continuation of Ser. No. 45,605, May 1, 1987, Pat. No. 4,757,256, which is a continuation of Ser. No. 733,501, May 10, 1985, abandoned.

[51] Int. Cl.$^4$ ............................................. G01R 1/073
[52] U.S. Cl. ................................. 324/158 P; 324/72.5
[58] Field of Search ........... 324/158 P, 158 F, 73 PC, 324/72.5, 149

[56] References Cited

U.S. PATENT DOCUMENTS

| | | | |
|---|---|---|---|
| 3,835,387 | 9/1974 | Garretson et al. | 324/158 P |
| 4,480,223 | 10/1984 | Aigo | 324/158 P |
| 4,523,144 | 6/1985 | Okubo et al. | 324/158 P |

FOREIGN PATENT DOCUMENTS

| | | | |
|---|---|---|---|
| 23437 | 2/1980 | Japan | 324/158 P |
| 72060 | 4/1983 | Japan | 324/158 P |

*Primary Examiner*—Jerry Smith
*Assistant Examiner*—Stephen M. Baker
*Attorney, Agent, or Firm*—David B. Harrison

[57] ABSTRACT

A high density epoxy ring probe card includes a unitary printed circuit board having a central opening adapted to receive a preformed epoxy ring array of probes. The board has a multiplicity of conductive traces, there being a first set of traces formed on a lower major surface thereof and a second set of traces formed on an upper major surface thereof and interleaved radially vertically with respect to the first set; there being in total number at least as many traces as there are probes of said probe card. Feed through connectors are provided for feeding a connection for each upper trace through the printed circuit board to an inner annular region on the lower major surface of the printed circuit board adjacent said opening. The probes are epoxed to the ring in two interleaved and vertically separated rows, with the lower row being connected directly to the first set and with the upper row being connected to the second set via the lower surface of the printed circuit board.

2 Claims, 6 Drawing Sheets

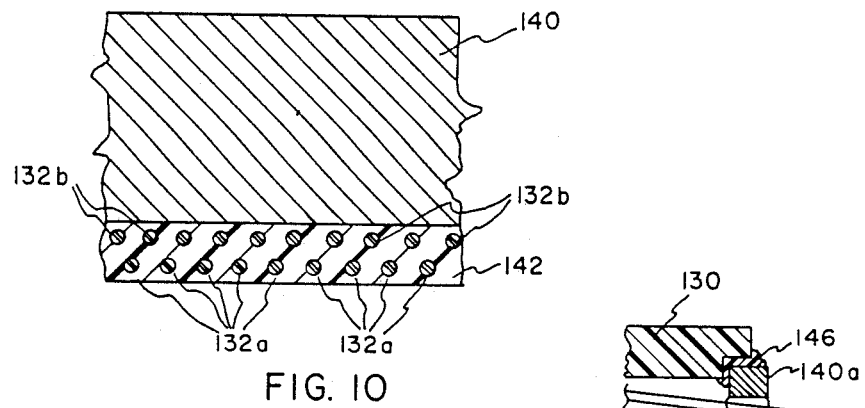
FIG. 10
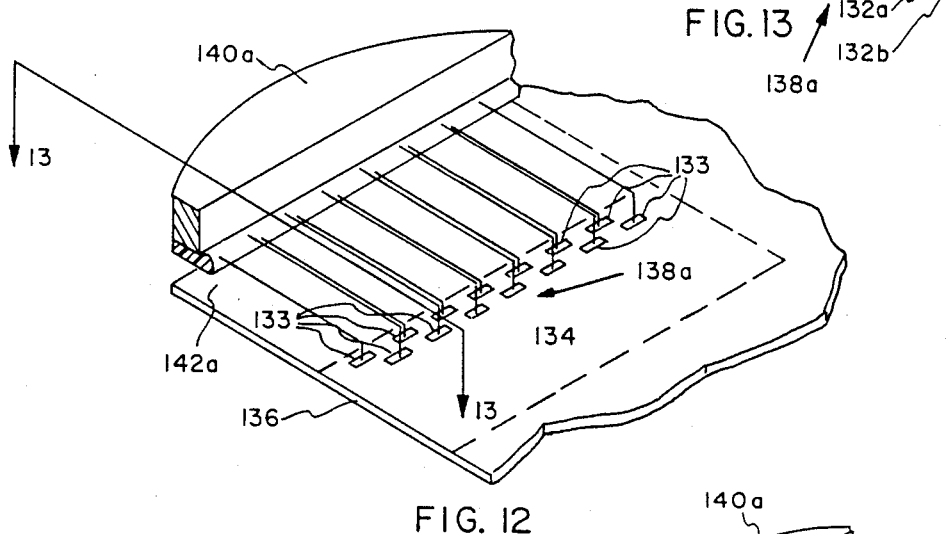
FIG. 13
FIG. 12
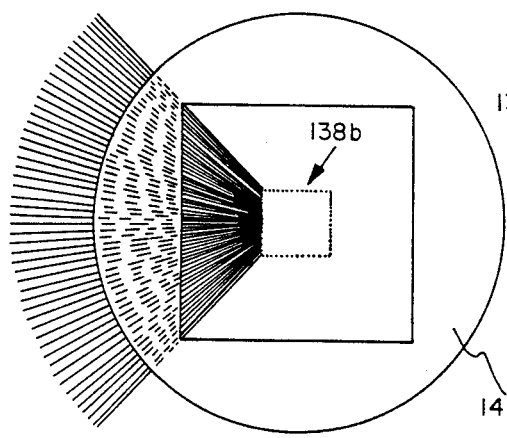
FIG. 11
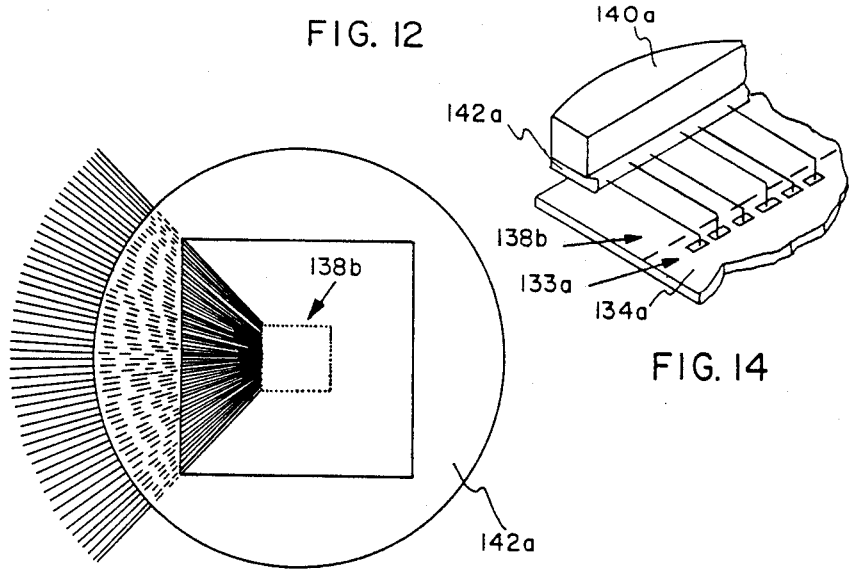
FIG. 14

HIGH DENSITY PROBE CARD

RELATED APPLICATIONS

The present application is a continuation of U.S. patent application Ser. No. 07/045,605, filed on May 1, 1987, now U.S. Pat. No. 4,757,256, which is a continuation of U.S. patent application Ser. No. 06/733,501, filed on May 10, 1985, now abandoned.

BACKGROUND OF THE INVENTION

The present invention relates to probe cards for testing unsevered integrated circuits formed on a semiconductor wafer. More particularly, the present invention relates to high density probe cards for testing very large scale integrated circuits having a multiplicity of connection pads with which connection may be made to conduct the testing.

Integrated circuits are typically formed on a semiconductor substrate by a series of processes involving the formation or deposition of a three dimensional pattern of metallic, insulating or semiconductor material on a major surface thereof. Connections to the integrated circuitry of the pattern are typically made at metallic connection pads formed at the periphery of the pattern. In the completed product, fine wires are used to connect these pads to pins of a carrier, such as a dual in-line package. Mounting of the integrated circuit die in a carrier and attachment of the fine wires is a time-consuming, labor intensive, expensive step in the process of manufacturing useable integrated circuits.

In order to achieve economies of volume, integrated circuits are formed as an array of substantially identical, replicated circuits on thin wafers of crystalline material, such as crystalline silicon. These wafers are typically four to eight inches in diameter. Before the individual circuit dies are severed from the wafer, each die is tested to be sure that it meets the specifications of the integrated circuit it embodies. This essential testing is carried out by apparatus employing probe cards.

The wafer is mounted on a moveable wafer stage, and a probe card, having an array of minute, spaced apart electrical probe needles, or probes, is brought into planar registration with the connection pads of each integrated circuit pattern formed on the wafer. Electrical conditions are then applied through the probes to the pads of the integrated circuit and the response of the circuit to appropriate electrical test conditions is then measured, also through the probes. If the circuit meets its specification, it is passed. If the circuit is defective, it is marked with a small drop of ink or paint, and ultimately it is discarded. By testing each circuit before it is severed from the die, only those circuits which are operational and meet the specification will continue in the manufacturing process.

Integrated circuit technology has now developed very high density circuits referred to as very large scale integration or VLSI. These circuits combine many thousands of transistor elements into a very small die. For example, with five mil centers for pads, and with 64 pads per edge, it is now possible to form a VLSI die having 256 to 320 peripheral connection pads with a minimum edge length of 320 mils. In practice, the pads on each edge are arranged in a staggered, two row "checkerboard" pattern. A hitherto unsolved need has arisen to provide a probe card having a density sufficiently high to test these new VLSI circuits on the wafer before they are severed into individual circuit dies.

The difficulty of providing as many as 256 to 320 probes in a probe card is not trivial. There are many parameters which must be carefully observed. These include:

Alignment. The alignment of a probe card (also known as "X-Y" positioning) is the degree of accuracy with which a probe contacts the specified target area of the integrated circuit's connection pad. This area is typically the center of the pad.

Probe Force. Probe force is the amount of force exerted on the metallic (aluminum) connection pad by the probe. Probe force is a function of the taper length, probe diameter, probe angle, and probe length to the location of securement at the support ring.

Overdrive. Overdrive is the amount of travel in the Z (height) direction of the probe card assembly after the first probe of the probe array has contacted the circuit pattern.

Contact Force. Contact force is the amount of force per square mil of area of the contact surface of the probe tip per mil of overdrive. Contact force is measured in grams per square mil per mil of overdrive.

Balanced Contact Force. It is important that the contact force with which each probe of the probe card array contacts each respective pad of the integrated circuit is substantially the same throughout the probe array. If the contact force from probe to probe is not substantially the same, the contact ohmic resistance from probe to probe will be different. If the contact ohmic resistance from probe to probe is different, the signal integrity throughout the probe array will not be uniform. Balanced contact force is especially important in testing sensitive integrated circuits which are designed to function at high speeds.

Scrub. Scrub is the distance the probe tip moves in the "Y" direction after its first contact with the connection pad to the designated overdrive. Scrub actually scrapes the connection pad and cuts through any thin coating of aluminum oxide or glass residue from the fabrication process.

Contact Resistance. Contact resistance is the resistance which occurs between the probe tip and the connection pad of the integrated circuit. The amount of contact resistance, measured in ohms, is a function of the composition of the probe, the composition of the metal pad being probed, the area of the contact surface of the probe tip and the probe force.

Planarization. Planarization of a probe card (also known as "Z" or height positioning) is the height positioning of the probe tips with respect to each other. A probe card is considered in planarization when all probes make electrical contact within a specified amount of overdrive travel between the first and last probes to make contact. Theoretically, a probe card is in perfect planarization if all probes make electrical contact at precisely the same time. Typically, a probe card is considered to be in planarization if there exists no more than 1.0 mil of overdrive travel between the first and last probes to make contact.

Several prior concepts have been proposed to solve the unique problems associated with high density probe cards for testing VLSI circuits. These prior concepts and approaches are summarized in the following discussion and illustrated in FIGS. 1 through 6 hereof. To facilitate clarity in understanding, similar elements are referred to in this specification with the same reference numeral.

One prior concept is to form an epoxy ring printed circuit probe card 30 with a set 32 of probes which are connected e.g. by solder 34 to conductive traces 36 formed on the bottom 38 of the card 30, as shown in FIGS. 1 and 2. An annular anodized aluminum ring 40 carries a cured shoulder formation 42 of epoxy resin which embeds and thereby aligns and secures the probes 32 in proper orientation and position. As shown in FIGS. 1 and 2, the probes 32 have a beam region or length 32a as measured from the inner wall 45 of the epoxy formation 42 to the probe taper or point 32b which is disposed at a predetermined angle relative to the horizontal, typically about seven degrees (7°). After the probe array comprising the aluminum ring 40, shoulder 42 and probe set 32 is preformed on a precise alignment fixture it is installed in an annular central opening 44 of the printed circuit card 30 and secured in place by a suitably curable epoxy resin 46. The prior art probe card 30 is generally in accordance with the disclosure of U.S. Pat. No. 3,905,098, for example.

A second prior concept, illustrated in FIG. 3, attempted to achieve higher density by combining the FIG. 1–2 approach with a second set 48 of probes connected to traces 50 formed on the top 52 of the card 30a by solder connections 54. After the first set 32 of probes is installed on the card 30, the second set 48 of probes is then installed by a second epoxy region 56 to the card 30a above the conventional probe ring 40.

The second approach as illustrated in FIG. 3 has a number of drawbacks: it is difficult to construct. It will not easily meet the criteria for acceptable probe cards discussed above. For example, the probe tips 48b of the second set 48 attack the pads of the VLSI circuit at a much sharper angle than do the probes of the first set 32. The sharper angle of the beam region 48a of the second set 48 greatly increases the contact force applied to the pad, and reduces the amount of scrub.

The contact force of the probes 48a will be different than the contact force of the probes 32a; hence, balanced contact force throughout the entire probe array is difficult to achieve. Planarization and alignment are also very difficult to achieve with the FIG. 3 approach, absent a highly complex fabrication fixture.

Another prior concept, illustrated by FIG. 4, calls for two sets of probes on the card, with a conventional probe array set 32 on the bottom 38 and with an array of probe-holding blades 58 connecting from printed circuit traces 50a on the upper surfaces to probes 60 held by the blades 58 near the VLSI chip, as diagrammed in the FIG. 4 sectional view. The probe needle holding blades 58 may be of the type described in U.S. Pat. No. 3,849,728, and may be soldered to the traces 50a along metalized lower edges as shown in FIG. 4.

If the blades 58 are made of metal, significant problems arise with the increase in capacitive coupling between probes such blade structures present. If the blades 58 are made of ceramic, they are very brittle and difficult to handle. Moreover, ceramic has proven unreliable because of the alignment and planarization problems introduced by the differences in coefficients of expansion between the ceramic or metal blade 58 and the tungsten probe wire 60, solder 62 and printed circuit trace materials 50a. It will be appreciated that the solder bead 62 required to secure the blade 58 to its corresponding trace 50a is vastly more elongated and extensive than the solder beads 36 used to connect each lower probe wire 32 to its corresponding lower trace 34.

One other significant drawback of the FIG. 4 approach is that the substantially shorter beam lengths of the probes 60 make the establishment of balanced contact force throughout the overall probe array more difficult.

Yet another prior concept, illustrated diagrammatically in FIG. 5, requires the use of two printed circuit boards, a so-called mother board 30c, and a so-called daughter board 30d. The mother board 30c carries the outer set of probes 63 in conventional fashion, and the daughter board 30d carries the inner set of probes 64. The daughter board 30d fits into an annular recess 68 formed in the mother board 30c, and a series of flexible conductive traces, held in place by a foam compression gasket 70 (metal on erastma) interconnect traces 72 on the top of the daughter board 30d to corresponding conductive traces 74 on the top of the mother board 30c. An annular frog ring 73 supports the mother board 30c and is itself connected mechanically to an upper test card 30e. Pogo pins 76 provide electrical connections between traces on the lower surface of the test card 30e and the traces 74 of the mother board 30c. An inner annular housing 78 holds the daughter board 30d and the foamed connector 70 in place against the mother board 30c. An inner flange 80 of the frog ring 73 retains the inner housing 78 in place.

One drawback of the multiple printed circuit board solution is its complexity. Another drawback is that the compression connection 70 may not prove to be reliable. A further drawback is that of impedance matching both sets of probes to a nominal impedance, such as 50 ohms or 93 ohms, the two standard impedances followed in the probe card industry. One other significant drawback is that the inner housing 78 makes it impossible to add certain needed circuit elements, preferably to the top of the daughter board 30d. These elements are typically small bypass capacitors, which are added to the probe arrays in the vicinity of the inner annular opening 44.

The FIG. 5 arrangement additionally suffers from the significant drawback that the probe force applied by each of the probes 64 of the inner set is difficult to balance with the force applied by each of the probes 63 of the outer set.

Yet one more prior concept probe card 30f is illustrated in the FIG. 6A–6B drawing pair. This prior concept follows the concept outlined in connection with FIGS. 1 and 2, except that a higher density is achieved by staggering the probes of the probe array. The probes 32 are arranged into a lower row 32c and an upper row 32d which is offset radially and interleaved with the lower row 32c. The probe wires 32e extend radially outwardly to traces 34a on the lower surface 38 of the probe card 30f.

The drawback and ultimate density limitation for the probe card 30f is that the traces 34a are formed on the same lower surface 38 and must be located at the same radial distance. The single set of traces carry all of the connections for all of the probes 32. In order for there to be sufficient spacing for 256 to 320 radial traces 34a, they must be radially spaced from the central opening a sufficient distance to allow for minimum trace width and for insulative spacing between the traces. This means that the traces 34a are set back so far that the probe wires 32e extend a considreable distance in very close proximity. This close proximity leads directly to shorts and to undesirable coupling and electrical crosstalk between the probes.

The probing equipment, the test head and its interface hardware dictate the size of the probe card to be used for testing the integrated circuit. More specifically, the test head and the test head interface hardware dictate the outer radial distances to which the probe traces can extend. These outer radial distances in turn limit the number of probes traces and the amount of space between those traces on a give circumference. With the limited size of the probe card and the limited radial distances of the probe traces from center, and with the resultant closeness of adjacent traces, it is extremely difficult to construct a high density probe card of the type illustrated in FIGS. 6A and 6B, due to the liklihood that adjacent probe wires, especially those at the corners of the integrated circuit, will contact one another and become shorted. This is especially true with a rectangular integrated circuit layout, or a square layout for an integrated circuit whose connection pads are not necessarily uniformly distributed along the sides.

SUMMARY OF THE INVENTION WITH OBJECTS

A general object of the present invention is to provide a probe card which overcomes the limitations and drawbacks of the prior art.

One specific object of the present invention is to provide an improved epoxy ring probe card which effectively provides a higher number and density of individual test probes than heretofore achieved.

A further object of the present invention is to provide an improved probe card assembly which provides radial circuit traces on two surfaces of the card in an interstitial spacing arrangement in order to facilitate fabrication and achieve higher numbers and densities of probes than heretofore.

Another object of the present invention is to provide a high density probe card of two sets of probes, wherein each probe is matched in performance characteristics to the other probes, irrespective of which set the probe may be within.

One more object of the present invention is to provide a high density probe card of two sets of probes wherein conductive traces on both surfaces of the card connect to both sets of probes in an arrangement providing matched impedances of e.g. 50 ohms, and low capacitive coupling, thereby enabling clocking speeds to reach 100 MHz and higher.

A further object of the present invention is to provide a high density probe card of two sets of probes wherein the contact force of one set is balanced with the contact force of the other set, and the scrub of both sets is essentially the same distance.

Yet another object of the present invention is to provide a high density probe card construction which facilitates access to all probe connections thereby enabling connection of additional electrical components, such as capacitors, resistors, and the like.

One further object of the present invention is to provide an optimized high density probe card having more precisely controllable electrical impedance characteristics by virtue of the latitude provided by greater trace width for each trace, while at the same time providing sufficient working room for mechanical/electrical attachment of all of the probe wires to their respective traces.

One more object of the present invention is to provide a high density probe card which is vastly simplified, less expensive, more reliable, more readily manufacturable and more readily reparable than prior high density probe cards.

These objects are achieved in a high density probe card for use with testing apparatus in order to contact and test unsevered very large scale integrated circuit dies replicatively formed on a planar semiconductor wafer. The probe card includes a unitary printed circuit board having a central opening adapted to receive a preformed array of probes. The board has a multiplicity of conductive traces, there being a first set of traces formed on a lower major surface thereof and a second set of traces formed on an upper major surface thereof, there being in total number at least as many traces as there are probes of said probe card. Feed through connectors are provided for feeding a connection for each upper trace through the printed circuit board to an inner annular region on the lower major surface of the printed circuit board adjacent said opening.

The preformed probe array includes an annular frame, and two sets of spaced apart probes bonded to the annular frame e.g. by curable resin material. The probes are bonded in alignment position relative to respective connection pads formed on each of the identical dies of the wafer. The adjacent probes of both sets are substantially parallel with each other, one set of probes being adjacently spaced apart from the other set thereof. One set of probes is adapted for electrical connection to the first set of traces on the lower surface, and the other set of probes is adapted for electrical connection to the second set of traces on the upper surface of the printed circuit probe card, in all cases via the lower surface thereof.

As one aspect of the invention, the second set of traces on the upper surface are interstitially arranged relative to the first set of traces on the lower surface, and the probe array includes a third set of conductive traces formed on the lower surface of the printed circuit board in the inner annular region. In this particular aspect, the feed through connectors include conductive bridges passing through the printed circuit board whereby each of the third set of traces becomes electrically connected to a corresponding trace of the second set of traces. Each of the other set of probes is then bonded to a corresponding one of the third set of traces.

In one more aspect of the invention, each of the first set of printed circuit traces includes a raised bonding region extending away from the lower major surface of the printed circuit probe card in order to facilitate spacing of the one set of probes away from the other set of probes in the region adjacently outside of the annular probe frame.

In a further aspect of the invention, the printed circuit probe card is formed with three layers of conductive traces: a first layer on the lower major surface on which the first set of traces is formed, a second layer on the upper surface on which the second set of traces is formed, and an intermediate third layer interconnected with the second layer via conductive bridges passing through the printed circuit board in the inner annular region. A third set of traces is formed in this intermediate third layer, and the inner annular region is removed in order to expose the third set of traces to which the other set of probes is connected.

In yet another aspect, an array of openings is provided through the printed circuit probe card to provide for the feed through connectors extending from the lower inner annular region to the upper surface and for connecting with the second set of traces formed thereon.

In still one other aspect, the feed through connectors comprise a series of pins secured to the other set of probes in alignment with openings formed through the printed circuit probe card, wherein the pins are adapted to be bonded to the second set of traces to establish electrical connection therewith.

In yet one more aspect, the feed through connectors comprise a vertically bent portion of each of the other set of probes. Each bent portion is prealigned with an opening formed through the printed circuit probe card. An upper terminous of each bent portion may then be bonded to the second set of traces in order to establish and maintain electrical connection therewith.

These and other objects, advantages and features of the present invention will be further appreciated from a consideration of the following detailed description of preferred embodiments presented in conjunction with the accompanying drawings.

BRIEF DESCRIPTION OF THE DRAWINGS

In the Drawings.

Prior Art Illustrations

Illustrations of the Inventive Concepts

Figure 1:
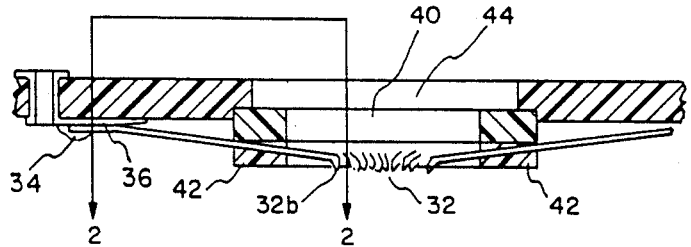
FIG. 1 is a diagrammatic view in side elevation and section of a conventional low to medium density epoxy ring probe card as taught by the prior art, for example, U.S. Pat. No. 3,905,098, and as already discussed above.
Figure 2:
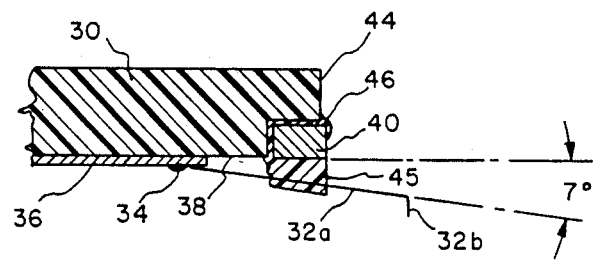
FIG. 2 is an enlarged diagrammatic view in side elevation and section of the prior art probe card shown in FIG. 1, along line 2—2.
Figure 3:
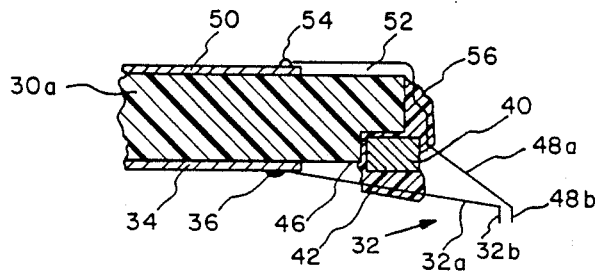
FIG. 3 is an enlarged diagrammatic view in side elevation and section of a portion of a second prior art high density probe card concept, already discussed above.
Figure 4:
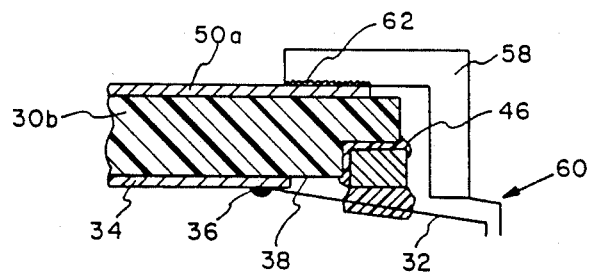
FIG. 4 is an enlarged diagrammatic view in side elevation and section of a portion of a third prior art high density probe card concept, already discussed above.
Figure 5:
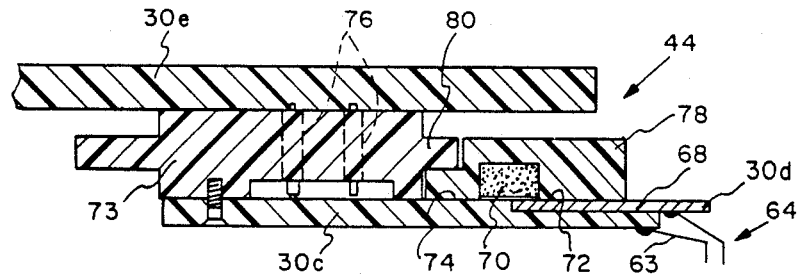
FIG. 5 is an enlarged diagrammatic view in side elevation and section of a portion of a fourth prior art high density probe card concept employing a mother board carrying a first set of probes and an inner annular daughter board carrying a second set of probes and which is nested with and retained by the mother board and other related support structure, as discussed above in greater detail.
Figure 6A:
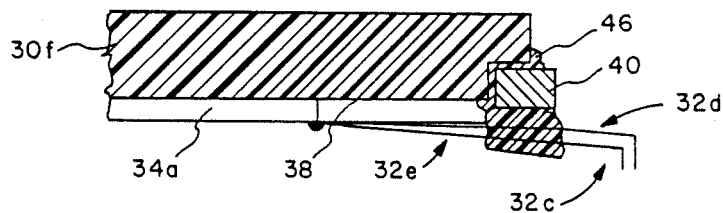
FIGS. 6A and 6B provide side section and bottom plan views of a fifth prior art higher density probe card in which all of the connection traces are formed on the lower surface of the probe card at the same radial length which is a substantial distance away from the probe array itself, as discussed above in greater detail.
Figure 6B:
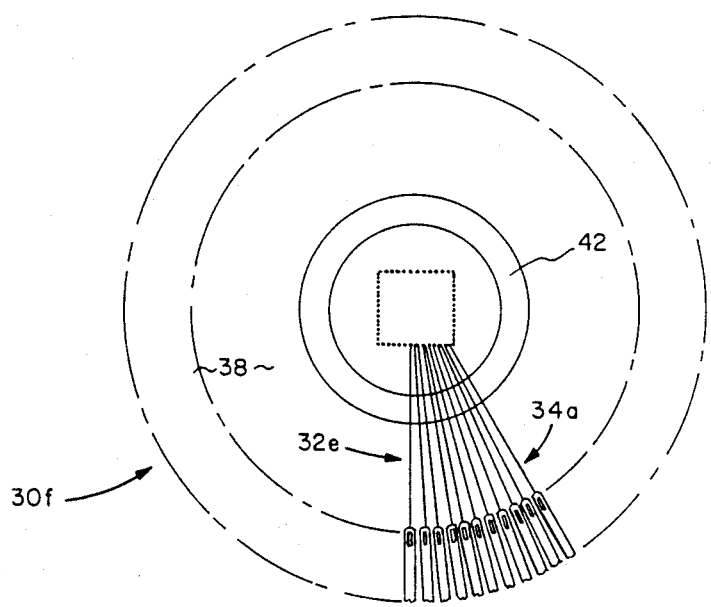
Figure 7:
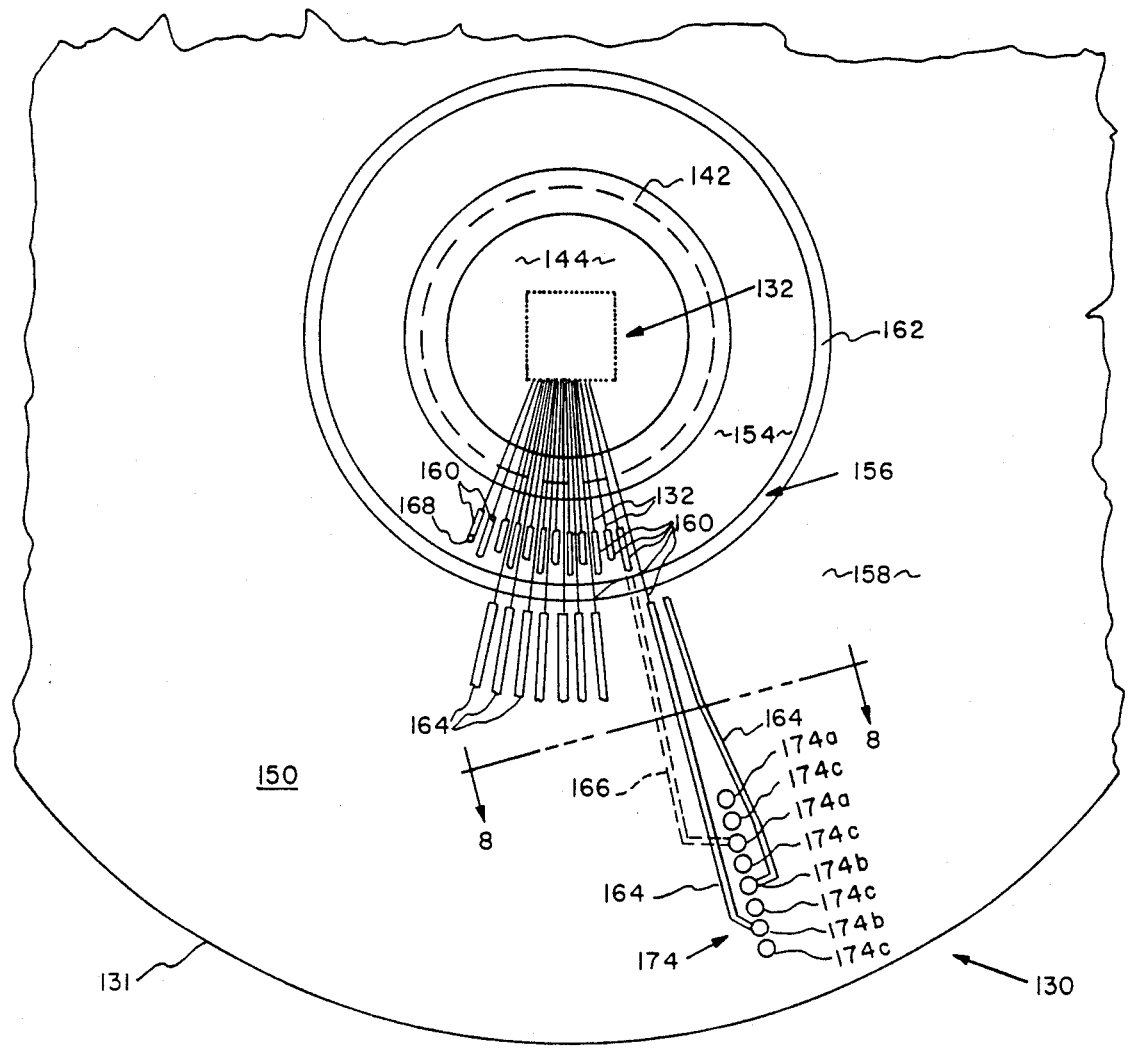

FIG. 7 is an enlarged bottom plan view of a relevant representative portion of a high density probe card incorporating the principles of the present invention, with some of the probes and traces not shown completely (the e.g. square locos of probe tip is shown) in order to save drawing room and thereby promote understanding of the present invention.

Figure 8:
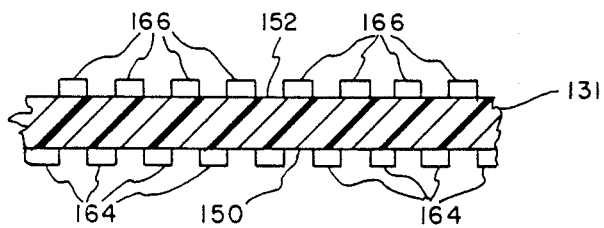

FIG. 8 is a view in section and elevation of a portion of the probe card set forth in FIG. 7 taken along the line 8—8 in FIG. 7 and showing the interstitial relation between the first set of traces on the bottom side and the second set of traces on the top side of the probe printed circuit card.

Figure 9:
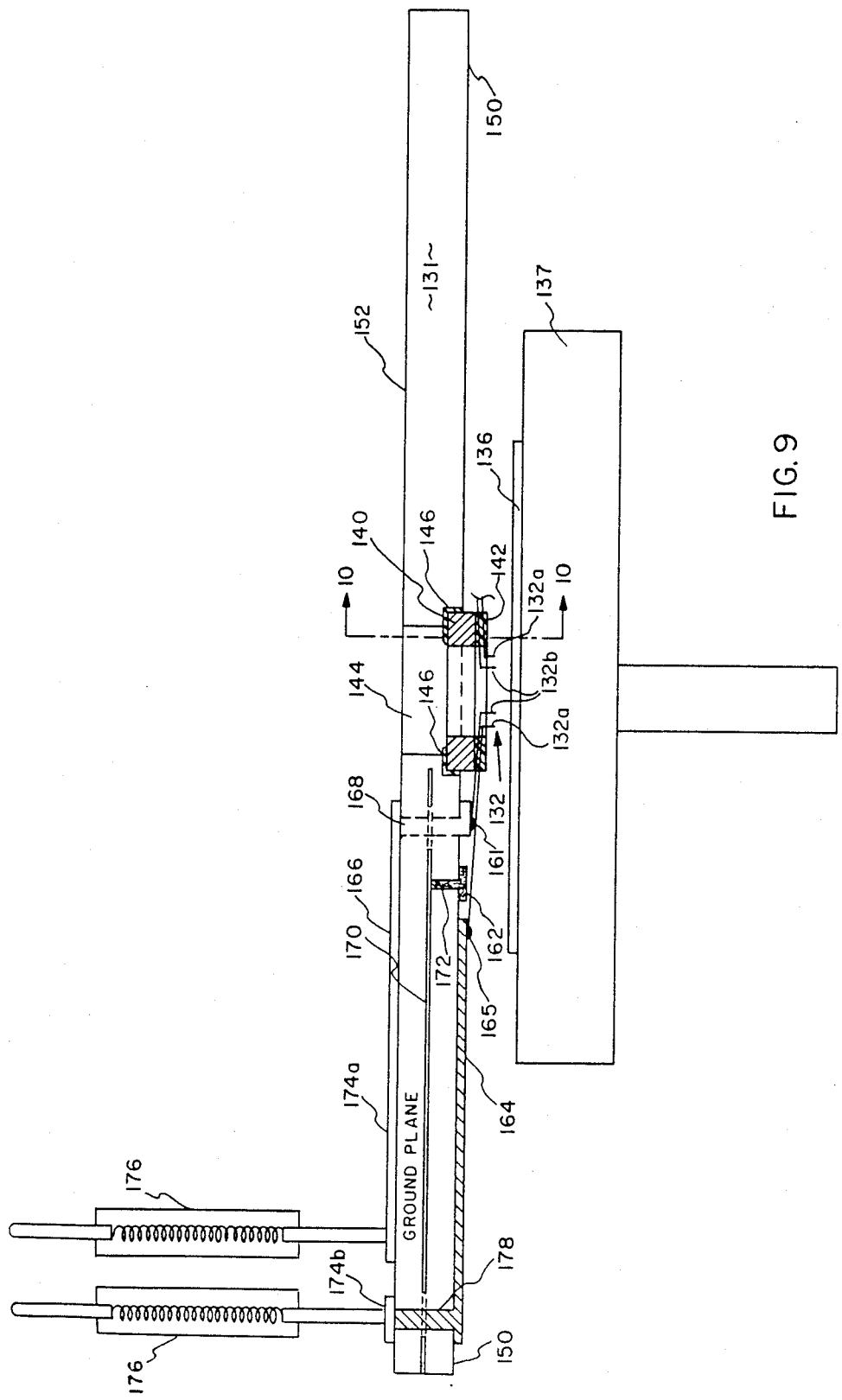

FIG. 9 is a diagrammatic view in side elevation and section of the high density probe card depicted in FIG. 7, with an integrated circuit wafer shown mounted on a wafer chuck, and with electrical connections to the probe card being made by pogo pin connectors, also shown diagramatically for illustration.

FIG. 10 is a sectional view in side elevation of the high density probe card taken along the line 10—10 in FIG. 9.

FIG. 11 is an enlarged bottom plan view of a rectangular probe array variant for inclusion in a high density probe card similar to the one depicted in FIGS. 7-10 in which the inner plan configuration of the annodized ring and epoxy is square rather than circular.

FIG. 12 is a greatly enlarged view in perspective of the probe array depicted in FIG. 11 showing the alignment of two sets of staggered probes with corresponding staggered pads of an unsevered VLSI circuit formed on a wafer undergoing electrical testing via probe card contact.

FIG. 13 is an enlarged diagrammatic view in side elevation and section of a portion of the probe array depicted in FIG. 12, taken along the line 13—13 in FIG. 12.

FIG. 14 is an enlarged somewhat more diagramatic view in side elevation of a variant of the probe array depicted in FIGS. 11-13, wherein the contact pads of the unsevered VLSI circuit are in-line and wherein the two sets of probes are also in-line to match the pads.

Figure 15:
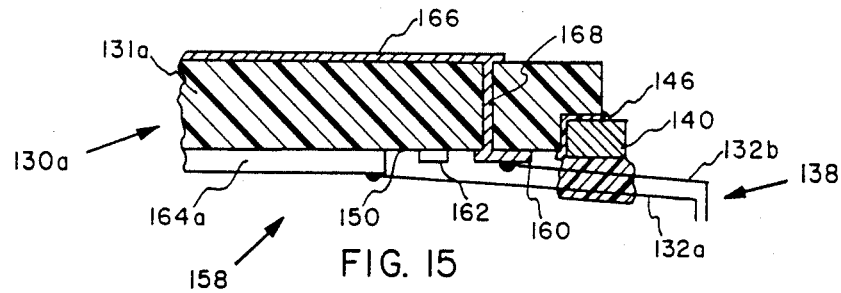

FIG. 15 is an enlarged diagrammatic view in side elevation and section of a portion of a variant of the the probe card depicted in FIGS. 7 through 10.

Figure 16:
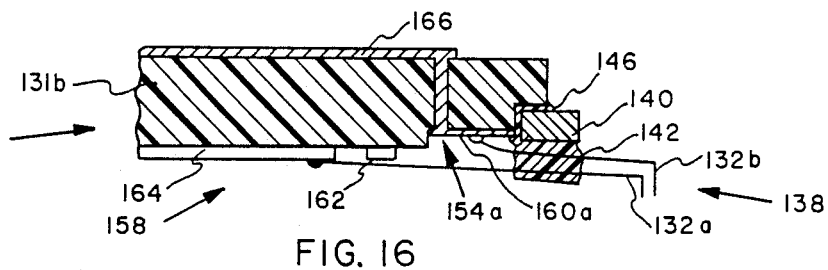

FIG. 16 is an enlarged diagrammatic view in side elevation and section of a portion of another embodiment of a high density probe card incorporating the principles of the present invention.

Figure 17:
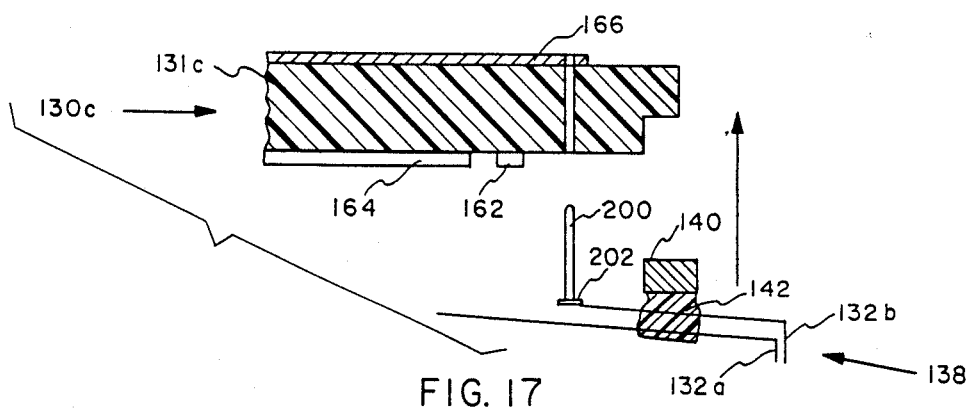

FIG. 17 is an enlarged and exploded diagrammatic view in side elevation and section of a portion of a further embodiment of a high density probe card incorporating the principles of the present invention.

Figure 18:
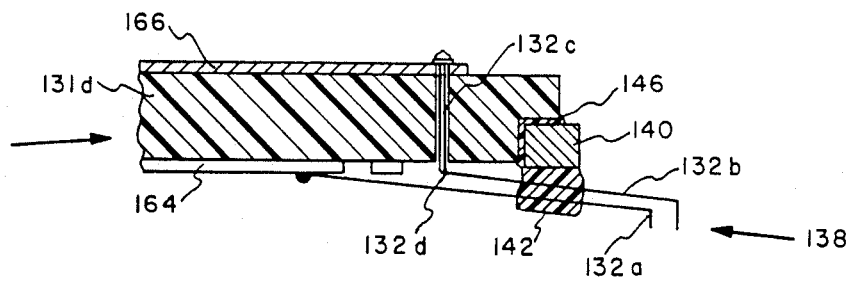

FIG. 18 is an enlarged diagrammatic view in side elevation and section of one more embodiment of a high density probe card incorporating the principles of the present invention.

DETAILED DESCRIPTION OF PREFERRED EMBODIMENTS

With reference to FIGS. 7 through 10, a high density epoxy ring probe card 130 is formed of a planar printed circuit board 131 and includes an array of a multiplicity of electrical contact providing probes 132 for engaging connection pads 133 of a very large scale integrated circuit 134 (shown by broken lines in FIG. 12) formed as one of many such circuits upon a major surface of a semiconductor wafer 136.

As seen in FIG. 9, the wafer 136 is supported upon a precision X-Y support stage 137. The wafer 136 is held to the stage 137 by the application of a vacuum through orifices formed through the stage 137 (not shown). By conforming to the highly planarized support surface of the stage 137, the wafer 136 itself becomes highly planar and suitable for being contacted by the probes 132 of the card 130. The stage 137 is moved in the X and Y directions so that each VLSI circuit 134 may be properly registered in test position directly under the probes 132. After each circuit 134 is tested, it is passed or rejected, depending upon whether it meets the predetermined electrical performance specifications for the particular circuit being manufactured.

The probe card 130 includes a preformed probe array 138 including an anodized aluminum ring 140, and an epoxy shoulder 142 in which the probes 132 are embedded and secured in predetermined proper alignment with the pads 133. The array ring 140 and the epoxy shoulder 142 carrying the probes 132 are secured in a grooved central annular opening 144 formed for the purpose of holding the array 138 by cured epoxy resin 146.

The probe array 138 is of a high probe density, meaning that with the present invention, as many as 264 to 320 probes may be provided within the array 138. This high density means that there are at least 0.7 probes per degree of rotation about an imaginary axis extending through the center of the circuit 134 and normal to the surface thereof being probed by the probe card 130.

The probe card 130 includes a bottom major surface 150 and a top major surface 152. In the preferred embodiment illustrated in FIGS. 7–10, the bottom major surface 150 is divided into three generally annular regions: an inner region 154 adjacent the probes 132 and central opening 144, a middle separation region 156 and an outer region 158.

A series of radial connection pads or traces 160 is formed in the inner annular region 154. An annular ground shield 162 is disposed in the middle separation region 156, and a series of radial connection traces 164 is formed in the outer annular region 158.

The separation region 156 physically separates the connection traces 160 of the inner annular region or zone 154 from the connection traces 164 of the outer annular region or zone 158, in addition to providing room for the ground shield trace 162.

The probe array 138 or probes 132 is formed so that there are two rows of probes, a lower row 132a and an upper row 132b. The upper row 132b is horizontally offset relative to the lower row 132a so that each probe wire 132b of the upper row is spaced equally between the probe wires 132a of the lower row, and vice versa, as shown in FIG. 10.

Also, it should be noted that the radial connection traces 160 of the inner region 154 are equally spaced between the radial centers of the radial connection paths or traces 164 of the outer annular region 158. The probe wires of the upper row 132b are first attached to respective ones of the traces 160 of the inner annular region by solder connections 161, and the probe wires of the lower row 132a are subsequently attached to respective ones of the traces 164 of the outer annular region 158, also by solder connections 165.

A series of radial connection paths or traces 166 is formed on the top major surface 152 of the probe card 130. Each of these traces is electrically connected to a radially aligned, corresponding pads or trace 160 of the inner annular region 154 of the lower surface by plated-through areas 168 bridging both surfaces 150 and 152 of the card 130.

The traces 166 of the top surace 152 are spatially equally offset from the traces 164 of the bottom surface 150, as shown in FIG. 8. In this manner, the traces on both surfaces are provided with maximum isolation from each other and are subject to minimum inductive and/or capacitive cross-coupling and resultant crosstalk.

The printed circuit board 131 forming the probe card 130 may be formed with an internal planar layer of metal such as copper for providing a continuous shield and ground plane 170. The ground plane 170 further isolates and shields the traces 166 of the top surface 152 from the traces 164 of the bottom surface. Preferably, the annular shield 162 in the middle region 156 of the lower surface is electrically connected to the ground plane 170 by bridging regions 172 periodically spaced about the shield 162.

The annular probe card 130 includes an array of connection locations 174 disposed in symmetrically aligned and spaced apart radial rows along the outer periphery of the upper surface 152. These connection locations enable the probe card 130 to be connected electrically with host equipment, preferably by "pogo pins" 176 as shown in FIG. 9. Some of the connection locations 174a are integral end portions of the connection traces 166 of the top surface 152. Others 174b of the connection locations are island regions which are connected to the connection traces 164 of the bottom surface 150 by plated through bridging areas 178. Still other locations 174c make direct electrical connection with the ground plane 170 and enable ground contacts to be interspersed with signal contacts at the other locations 174a and 174b.

Another aspect of the present invention is that the overall connection length for the probes 132b of the upper row of the array 138 to respective connection locations 174a is the same overall length as for the probes 132a of the lower row of the array to respective connection locations 174b. This result is perhaps best illustrated by the diagrammatic sectional view of FIG. 9. Equal length connections tend to equalize electrical characteristics, particularly transit times, which are so important for proper testing of very high speed VLSI circuitry with clocking cycles as high as 40 MHz to 100 MHz.

In fabricating the array 138, a mylar mask is constructed which precisely follows the layout of the pads of the VLSI circuit 134 to be tested. A minute hole is formed in the mylar mask at the location of the center of each VLSI circuit connection pad 133. The mask is supported by an assembly drum which orients the probe wires and preliminarily holds them in place. A probe wire 132, typically of tungsten is formed with a tapered needle end depending downwardly to a contact point. The needle ends of the lower row 132a of probes are then placed through the outer holes of the mylar mask until all of the lower row 132a are in place and in proper alignment.

Next, an annulus of thin spacing material, such as card stock, may be placed over the lower row 132a radially just beyond the vicinity of the supporting member. Next, the upper row 132b of probes is installed with the needle ends thereof being precisely aligned by the mylar mask.

In the annular region 144 where the aluminum ring 140 is to be positioned, all of the spaces between the probe wires are filled manually with a thermosetting compound such as curable epoxy. The probe wires are carefully maintained in proper alignment position prior to cure. This manual epoxy placement procedure to fill each space is required because of the high viscosity of the compound and the high density of the probe wires at the annular site being filled with epoxy.

Then, curable epoxy resin of the same type is placed on the lower annular surface of the ring 140, and the epoxy coated supporting ring 140 is brought into contact to support the assembled probe array. The epoxy coating on the ring 140 flows into and unifies with the epoxy already emplaced in the array itself. Finally, the drum holding the assembled array is placed in an oven and cured at a curing temperature for an appropriate time period. Any excess epoxy is removed from the inner and outer annular surfaces, and assembly is then removed from the jig. The assembly is now ready to be connected to the probe card 130.

The ring 140 is precisely oriented in the three relevant dimensions relative to the probe card 130 and is then glued to the probe card 130 in the central annular region 144, also preferably with a suitable thermosetting epoxy resin 146, as previously mentioned. After the resin 142 is cured, the individual probe wires 132 may then be soldered to their respective connection traces on the lower surface 150 of the probe card 130. In the embodiment of FIGS. 7-10 the upper row 132b of probes are soldered to their respective conductive traces 160 in the inner annular region 154 first, (with the lower row 132a probe wires bent slightly away from the bottom surface 150 to provide access to the wires of the upper row 132b). Then, the lower row of probe wires 132a are soldered to their respective conductive traces 164 in the outer annular region 158. The probe card 130 is then tested to check for alignment and planarity of the probes 132 and to be sure that there are no shorted probes or open or shorted circuits on the probe card itself. At this point construction of the probe card 130 is complete.

One of the drawbacks of a precisely annular probe array 138, as shown in FIGS. 7-10 is that the probes 132 vary somewhat in length, the shortest being those lying along a path which is the shortest distance from the edge of the VLSI circuit 134 being tested to the edge of the epoxy shoulder 142. With rectangular circuits, a rectangular shoulder may prove to be advantageous, and such a shoulder 142a, supported by a modified ring 140a, is illustrated in FIGS. 11 and 12. In this variant embodiment, the probe tip arrangement 138b is rectangular and the distances between the ring and shoulder and the probe tips are made to be virtually the same length for all probes of the array 138a.

A cross section of this arrangement 138a, FIG. 13, shows that the probes 132b of the upper row extend beyond the probes 132a of the lower row. In a practical example, the length of the lower probes 132a from ring to probe tip is approximately 7 mils, while the length of the upper probes 132b from the ring to each tip is approxiamtely 17 mils. Both rows are disposed at a preferred angle of declination, e.g. seven degrees (7°). This arrangement accomodates the "checkerboard" pattern of connection pads 133 as seen in FIG. 12.

In some cases, the connection pads of the VLSI circuit 134a are not staggered as in FIG. 12, but are in line. This arrangement 138b is illustrated in FIGS. 11 and 14.

Other embodiments incorporating the principles of the present invention are presently known. One alternative, shown in FIG. 15 provides a probe card 130a in which the traces 164a in the outer annular region 158 of the bottom surface 150 are formed to be thicker than the annular ground shield 162 and inner region traces 160. This height separation of the rearmost traces facilitates connection of the two rows 132a and 132b of the array 138, at some increased expense in the fabrication of the printed circuit 131a.

In another alternative probe card 130b, illustrated in FIG. 16, the inner annular region 154a is countersunk, so that the inner traces 160a are separated in elevation from the outer traces 164.

In yet another alternative probe card 130c, diagrammed in FIG. 17, the inner trace 160 and fixed connection bridge 168 (as present in the FIG. 15 embodiment) has been replaced by a pin 200 which passes through a suitable opening through the printed circuit board 131c so that it may be soldered directly to the corresponding upper trace 166. The advantage of the pin arrangement is that the pins may be soldered to the upper row 132b of probe wires before the array 138 is glued to the probe card 130c with the use of a suitable jig enabling precise positioning of the pins 200. In the event that a probe 132b has to be replaced, it may be unsoldered from its pin, and removed from the epoxy shoulder 142. A replacement probe may then be inserted through the shoulder 142 and soldered to the radially elongated head 202 of the pin 200.

The alternative probe card 130d, illustrated in FIG. 18, is quite similar to the card 130c shown in FIG. 17, except that instead of the pin 200, the upper probe wires 132b are bent at precisely the correct distance away from the ring 140, and the bent portions 132c are then passed through suitable openings through the printed circuit board 131d and soldered directly to the upper traces 166.

While apparatus and methods of the present invention have been summarized and explained by illustrative applications to high density epoxy ring probe cards for VLSI circuits formed on unsevered wafers, it will be readily apparent to those skilled in the art that many widely varying embodiments and applications are within the teaching and scope of the present invention, and that the examples presented herein are by way of illustration only and should not be construed as limiting the scope of the invention.

We claim:

1. A method of forming a high density epoxy ring probe card for enabling testing apparatus to contact and test unsevered large scale integrated circuit dies replicatively formed on a planar semiconductor wafer, said method comprising the steps of:

forming a unitary printed circuit board with a central opening, a first set of conductive traces on a lower major surface thereof, and a second set of traces formed on an upper major surface thereof, there being in number at least as many traces as there are probes of said probe card to be formed;

forming a probe array by:
   forming an annular frame,
   forming said two sets of spaced apart discrete wire probes by:
      spacing said first set of probes adjacently apart from the second set thereof so that said first set lies in a first cone and the said second set lies in a second cone substantially congruent with the first cone, and wherein the probes of said first set are interleaved in vertical cross section with respect to the probes of said second set,
   adapting said first set of probes for electrical connection to said first set of traces located entirely within an outer region on said lower surace and adapting said second set of probes for electrical connection to said second set of traces on said upper surface, via an inner region formed entirely inside of and separated from the outer region by a separation zone on the lower surface, and bonding said sets to said annular frame by curable resin material in alignment position relative to respective connection pads of each said die, aligning and mounting said formed array in said central opening with curable resin material, and electrically connecting said probes of said second set to said second set of traces via the lower surface and electrically connecting said probes of said first set to said first set of traces on the lower surface, so that said probe card is formed with a capacity for providing a probe wire plan view density of not less than 0.7 probes per degree of rotation about a center axis of and normal to said central opening of said unitary printed circuit board.

2. The method of forming a high density epoxy ring probe card as set forth in claim 1 wherein said step of bonding said sets to said annular frame by curable resin material in alignment position relative to respective connection pads of each said die comprises the steps of:

filling all of the spaces between the probes with a thermosetting compound such as curable epoxy resin material while maintaining all of the probes in proper alignment position, coating a lower annular surace of the annular frame with a thermosetting compound such as curable epoxy resin material, said compound being miscible with said compound filling the spaces between the probes, bringing the coated lower surface of the annular frame into contact with the filled and coated probes so that the compound on the frame flows into and unifies with the compound already placed between the probes, and curing said unified compound to complete said array.

* * * * *